United States Patent [19]
Anthony et al.

[11] 3,979,820
[45] Sept. 14, 1976

[54] DEEP DIODE LEAD THROUGHS

[75] Inventors: Thomas R. Anthony; Harvey E. Cline, both of Schenectady, N.Y.

[73] Assignee: General Electric Company, Schenectady, N.Y.

[22] Filed: Jan. 30, 1975

[21] Appl. No.: 545,496

Related U.S. Application Data

[62] Division of Ser. No. 411,295, Oct. 30, 1974, abandoned.

[52] U.S. Cl. .................................. 29/577; 29/580; 29/590; 148/171; 357/60; 357/68
[51] Int. Cl.² ..................................... B01J 17/00
[58] Field of Search ................ 29/580, 577, 590; 148/171

[56] References Cited
UNITED STATES PATENTS

| | | | |
|---|---|---|---|
| 2,813,048 | 11/1957 | Pfaun | 148/171 |
| 3,419,955 | 1/1969 | Schutze | 29/580 |
| 3,764,409 | 10/1973 | Nomura | 29/580 |

*Primary Examiner*—W. Tupman
*Attorney, Agent, or Firm*—Donald M. Winegar; Joseph T. Cohen; Jerome C. Squillaro

[57] ABSTRACT

A body of semiconductor material has two major opposed surfaces. A region of recrystallized semiconductor material having solid solubility of a dopant material therein is disposed within, and extends entirely through the body and intersects the two major opposed surfaces. The recrystallized region of material is employed as an electrical means to interconnect electrical elements associated with the respective opposed major surfaces.

41 Claims, 4 Drawing Figures

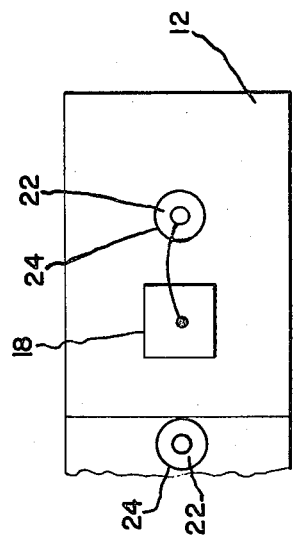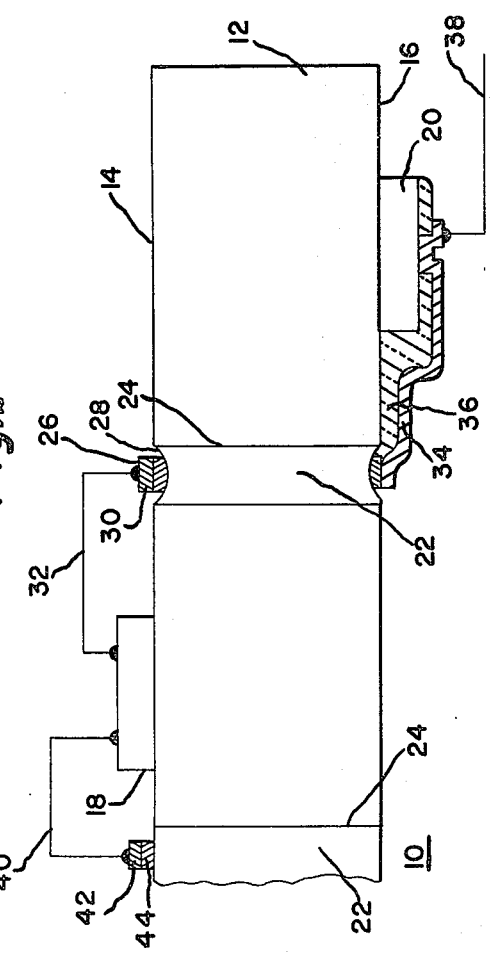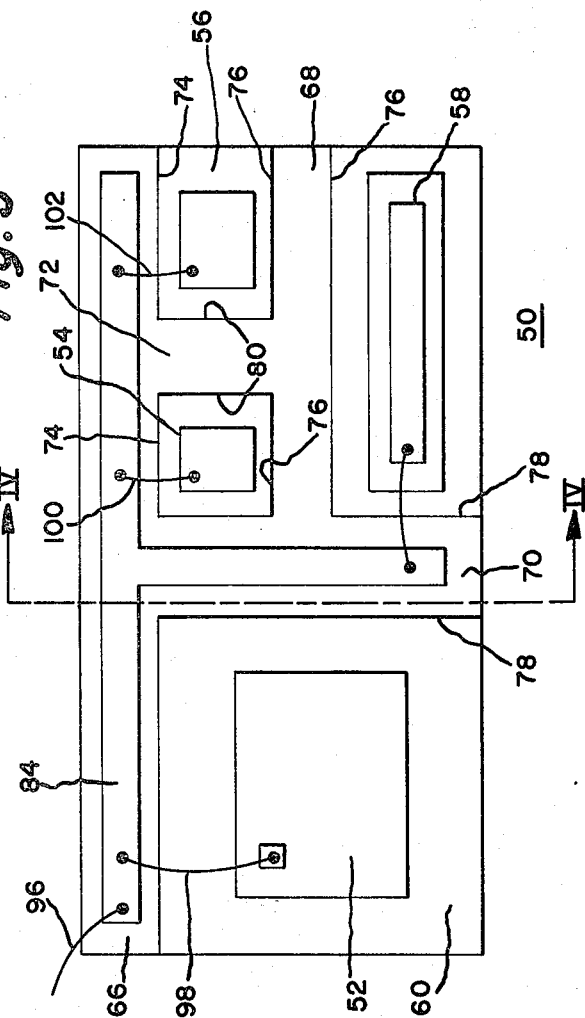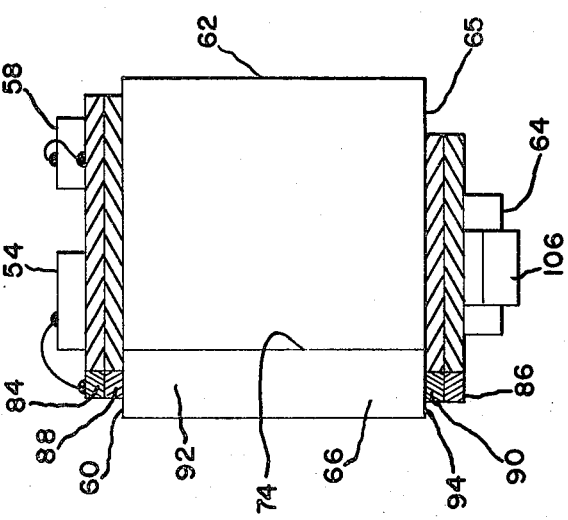

DEEP DIODE LEAD THROUGHS

This is a continuation, division, of application Ser. No. 411,295, filed Oct. 30, 1974, now abandoned.

BACKGROUND OF THE INVENTION

1. Field of the Invention

This invention relates to semiconductor devices and in particular to a means for electrically interconnecting electrical elements associated with opposed major surfaces of the body.

2. Description of the Prior Art

Electrical leads between opposed major surfaces in integrated circuit devices are difficult to produce, involve extensive process steps as well as care of practicing the same, and tend to be unreliable. Electrical paths between the two surfaces require single or double diffusion steps. The resulting regions are excessively wide and the electrical conductivity of the region decreases with increasing depth into the semiconductor material from the diffusion surface. The decrease in electrical conductivity minimizes the circuit designs which may be employed in such a device. Additionally, the diffused regions require large volumes of material because of the lateral diffusion of the dopant material during the different drive processes. A satisfactory electrical lead through the body of material would enable a circuit designer to utilize both sides of the body for electrical circuits and enable one to achieve high density packaging of devices on individual chips.

An object of this invention is to provide a new and improved electrical cross-over means for semiconductor devices which overcome the deficiencies of the prior art.

Another object of this invention is to provide a new and improved electrical conductive path between two major opposed surfaces of the body of semiconductor material.

Another object of this invention is to provide a recrystallized region of semiconductor material having solid solubility of a dopant material therein which functions as an electrically conductive path between two opposed major surfaces of a semiconductor device.

Other objects will, in part, be obvious and will, in part, appear hereinafter.

BRIEF DESCRIPTION OF THE INVENTION

In accordance with the teachings of this invention, there is provided a semiconductor device comprising a body of semiconductor material. The body has two major opposed surfaces, a selected resistivity and a selected type conductivity. At least one region of second and opposite type conductivity and a selected resistivity is disposed in the body and extends between and terminates in the two major opposed surfaces. Each region of second type conductivity has opposed end surfaces, each of which is coextensive with one of the two major surfaces of the body. The material of each of the regions of second type conductivity is recrystallized material of the body having solid solubility of a material therein which imparts the selective type conductivity and resistivity thereto. Each region is a low electrical resistance path for conducting electrical current between the two opposed major surfaces. A P-N junction is formed by the contiguous surfaces of the opposite type conductivity materials of the respective region and body. The regions function as electrical lead throughs to electrically interconnect electrical devices associated with the respective opposed major surfaces. Regions having a planar configuration also function as electrical lead throughs as well as P-N junction isolation regions to electrically isolate mutually adjacent electrical devices as required.

DESCRIPTION OF THE DRAWINGS

FIG. 1 is an elevation view, partly in crosssection, of a portion of a semiconductor device embodying a lead through of this invention;

FIG. 2 is a top planar view of the device of FIG. 1;

FIG. 3 is a top planar view of another semiconductor device, embodying an alternate embodiment of a lead through of this invention, and FIG. 4 is an elevation view, partly in crosssection, of the device of FIG. 3 taking along the cutting plane IV—IV.

DESCRIPTION OF THE INVENTION

With reference to FIG. 1, where is shown a semiconductor device 10 comprising a body 12 of semiconductor material. The body 12 has a selected conductivity, a selected resistivity and opposed major surfaces 14 and 16. The semiconductor material comprising the body 12 may be silicon, germanium, silicon carbide, gallium arsenide, a compound of a Group II element and a Group VI element and a compound of a Group III and a Group V element.

One or more electrical devices 18 are associated with the surface 14 and one or more electrical devices 20 are associated with the surface 16. By the word associated, we mean that the electrical device may be an integrated circuit or an individual element that is either formed in the body 12 at the particular surface, has a mesa configuration or is affixed to the surface.

A region 22 of recrystallized semiconductor material having solid solubility of an impurity dopant therein extends completely through the body 12 from surface 14 to surface 16. The region 22 preferably has as high a concentration of dopant material therein to minimize its electrical resistance to maximize its electrical conductivity. The region 22 forms an electrical path between the two surfaces 14 and 16. Preferably, the region 22 is of opposite type conductivity than the conductivity of the body 12 in order to prevent detrimental changes to the electrical parameters of the body 12 and the devices 18 and 20. A P-N junction 24 is formed by the contiguous surfaces of the material of opposite type conductivity.

The region 22 is preferably formed by a thermal gradient zone melting process. For example, an aluminum droplet migrated through a body 12 of N-type silicon produces a region 22 of recrystallized semiconductor material of the body 12 having P-type conductivity from the solid solubilty of aluminum therein.

The regions 22 are formed by lapping and polishing the surface 14 of the body 12. A suitable mask such, for example, as silicon oxide on a body 12 of silicon, is disposed or grown on the surface 12. Photolithographical techniques and selective etching is employed to open windows in the mask to expose preselected areas of the surface 14. The windows measure less than 0.05 cm on a side and have a triangular configuration for a (111) surface and a square configuration for a (100) surface. Selective etching of the semiconductor material produces etched depressions 20 microns deep in the surface 14 aligned with the windows in the mask. A metal film approximately 20 micron in thickness is vapor deposited on the mask and the etched selective areas of the surface 14. Selective etching or mechanical polishing is employed to remove the excess metal from the mask thereby leaving only the metal in the etched depressions.

The prepared body 12 is placed in a radiation thermal gradient apparatus at a pressure of $1 \times 10^{-5}$ torr. The metal is migrated through the body 12 by maintaining a thermal gradient substantially along the vertical axis of the body 12. For example, when the metal is aluminum, a thermal gradient of from 50°C per centimeter to 200°C per centimeter is practiced wherein the furnace temperature is from 700°C to 1350°C. The process is practiced for a sufficient time to migrate the metal droplet completely through the body 12 to the surface 16. Excess metal is removed from the surface 16 by mechanically polishing or selective etching.

For a more thorough discussion of the process of, and apparatus for, migration of metal wires, one is referred to our copending patent applications Method of Making Deep Diode Devices, U.S. Pat. No. 3,901,735; Deep Diode Device Production and Method, Ser. No. 411,021; Deep Diode Devices and Method and Apparatus, Ser. No.(RD-6506); and now abandoned in favor of Ser. No. 552,154. High Velocity Thermomigration Method of Making Deep Diodes, U.S. Pat. No. 3,898,106; Deep Diode Device Having Dislocation-Free P-N Junctions and Method, U.S. Pat. No. 3,902,925; and The Stabilized Droplet Method of Making Deep Diodes Having Uniform Electrical Properties, U.S. Pat. No. 3,899,361, filed concurrently with this application and assigned to the same assignee as this invention.

The resulting regions 24 are a low resistance and highly electrically conductive. The regions 24 comprise recrystallized material of the body 12 having solid solubility of metal therein to impart the resistivity and type conductivity to the region. The P-N junction 24 is well defined and exhibits substantially the ideal electrical characteristics to be expected for the materials involved.

An electrical contact 26 is affixed by a layer 28 of ohmic solder to the one end surface 30 of the region 22. An electrical lead 32 electrically interconnects the device and the region 22. An alternate means of electrically connecting electrical devices to the region 22 embodies an electrical contact 34 overlying in part a layer 36 of electrical insulating material, such for example, as silicon oxide, silicon nitride, aluminum oxide and the like. The layer 36 electrically isolates the contact 34 from accidental connections to unwanted devices, from short circuiting the circuits of the device 10 or from accidently shorting the P-N junction 24. A top planar view of this simple device arrangement is shown in FIG. 2.

Electrical devices 18 and 20 are electrically connected together. Electrical current flows into the device 20 via a lead 38 affixed to contact 34. The electrical current operates the circuitry of device 20 and flows also through the remainder of the contact 34 and via region 22, contact 30 and load 32 to device 18 and operates the circuitry or the device. Electrical current may then be carried via a lead 40 and electrical contact 42, affixed by a layer 44 of ohmic solder to region 22, through region 22 to the surface 16.

In essence, the configuration of the device 10 is that of a double sided printed circuit board. The region 22 acts as a plated through hole of a printed circuit board to electrically interconnect electrical circuits and devices mounted on the opposed major surfaces. The regions 22 act as electrical lead throughs. This novel concept enables one to have a more densely packed semiconductor chip since both sides of the body of silicon can be employed for device mounting. The electrical lead throughs or regions 22 permit a more efficient use of the semiconductor material. The lead throughs 22 may be formed before or after the devices 18 and 20 are fabricated or disposed on the respective surfaces 14 and 16 in accordance with manufacturing requirements.

It has been discovered that when the body 10 is of silicon, germanium, silicon carbide, gallium arsenide semiconductor material and the like, the droplet 22 has a preferred shape which also gives use to the region 24 being of the same shape as the droplet 22. In a crystal axis direction of <111> of thermal migration, the droplet 22 migrates as a triangular platelet laying in a (111) plane. The platelet is bounded on its edges by (112) planes. A droplet 22 layer larger than 0.10 centimeter or an edge is unstable and breaks up into several droplets during migration. A droplet 22 less than 0.0175 centimeter does not migrate into the body 10 because of a surface barrier problem.

The ratio of the droplet migration rate over the improved thermal gradient is a function of the temperature at which migration of the droplet 22 is practiced. At high temperatures, of the order of from 1100°C to 1400°C, the droplet migration velocity increases rapidly with increasing temperature. A velocity of 10 centimeters per day of $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is increased by a factor of 200.

A droplet 22 migrates in the <100> crystal axis direction as a pyramidal bounded by four forward (111) planes and a rear (100) plane. Careful control of the thermal gradient and migration rate is a necessity. Otherwise, a twisted region 24 may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted in a trapezoidal shape.

Referring now to FIGS. 3 and 4, migration of metal wires is employed to produce regions for both electrical isolation of mutually adjacent regions and still function as an electrical lead through. An electrical device 50 embodies electrical devices 52, 54, 56 and 58 associated with a surface 60 of a body 62 of semiconductor material. The body 62 comprises any of the materials which comprise the body 12 of FIGS. 1 and 2. An electrical device 64 is associated with a surface 65 of the body 12. The electrical devices 52, 54, 56, 58 and 64 may be integrated circuits, memory circuits, discrete elements and the like. Planar regions 66, 68, 70 and 72 are formed in the body 62. The planar regions 66 through 62 have solid solubility of dopant metal of sufficient concentration to impart opposite type conductivity to the regions than that of the body 12. The contiguous surfaces of the material of the regions 66 through 72 and the material of the body 62 form respective P-N junctions 74, 76, 78 and 80. The planar regions 66 through 72 function as electrical lead throughs between surfaces 60 and 65 for interconnecting electrical devices associated with the respective surfaces 60 and 65. Additionally, the regions 66 through 72 form P-N junction isolation regions as a grid configuration to provide electrical isolation between adjacent electrical devices as required. The planar regions 66 through 72 are produced by the thermomigration of metal wires through the body 62 by a temperature gradient zone melting process.

Preferred planar orientations, wire directions on the planar surface and axis of migration for material having a desired cubic crystal structure and the like are tabulated in Table.

Table I

| Wafer Plane | Migration Direction | Stable Wire Directions | Stable Wire Sizes |
|---|---|---|---|
| (100) | <100> | <011>* | 100 microns |
|  |  | <0$\bar{1}$1>* | 100 microns |
| (110) | <110> | <1$\bar{1}$0>* | 150 microns |
| (111) | <111> | a) <01$\bar{1}$> |  |
|  |  | <10$\bar{1}$> | 500 microns |
|  |  | <1$\bar{1}$0> |  |
|  |  | b) <11$\bar{2}$>* |  |
|  |  | <$\bar{2}$11>* | 500 microns |
|  |  | <1$\bar{2}$1>* |  |
|  |  | c) Any other Direction in (111) plane | 500 microns |

*The stability of the migrating wire is sensitive to the alignment of the thermal gradient with the <100>, <110> and <111> axis, respectively.
+ Group a is more stable than group b which is more stable than group c.

Suitable semiconductor materials of this crystal structure are silicon, silicon carbide, germanium and gallium arsenide. For a more complete description of the migration of metal wires, one is directed to our copending patent application "Deep Diode Line Migration", Serial No. 411,018, now U.S. Pat. No. 3,899,362, filed concurrently with this patent application and assigned to the same assignee of this invention.

For a more complete description of P-N junction isolation grid structures one is directed to a copending patent application entitled "Isolation Junctions For Semiconductor Devices", Ser. No. 519,914, by Manual Torreno and assigned to the same assignee as this patent application.

The planar regions 66 through 72 also function as buss bars. Electrical leads may be affixed directly to the regions 66 through 72 but, however, electrical contact material 84 and 86 is affixed by respective layers 88 and 90 of ohmic solder to selected areas of the respective opposed surfaces 92 and 94 of the regions 66 and 70 respectively. A lead 96 electrically connects the contact 84 to an external power source. Leads 96, 98, 100, 102 and 104 connect respective devices 52, 54, 56 and 58 to the contact 84 of the buss bar. Electrical current is conducted by the regions 66 and 70 to the contact 86 from which an electrical contact 104, overlying a layer of electrically insulating material not shown, is required, electrically connects the device 64 to the contact 86. Again the electrically insulating material is one such, for example, as silicon oxide, silicon nitride, aluminum oxide and the like.

It has also been discovered that migration of droplets and metal wires may be practiced in an inert gas atmosphere at a positive pressure, wherein the body of semiconductor material is a thin wafer of the order of 10 mil thickness. Lack of control of lateral thermal gradients does not appear to appreciably affect the process apparently because of the large ratio of planar surface area to side surface area.

We claim as our invention:

1. A process for making an electrically conductive lead through region in a semiconductor device comprising the process steps of:
    a. selecting a body of semiconductor material so that the body has two major opposed surfaces, at least one of the major surfaces having a preferred planar crystal structure orientation which is one selected from the group consisting of (100), (110) and (111), a vertical axis which is substantially aligned in parallel with a first preferred crystal axis of the material of the body, a preferred level of resistivity, and a preferred type of conductivity;
    b. vapor depositing at least one mass of a selective metal on a selective portion of the major surface of the body of semiconductor material having the preferred planar crystal structure orientation;
    c. heating the body and each mass of metal to an elevated temperature sufficient to form a melt of metal-rich semiconductor material of the body for each mass, the melt comprising the vapor deposited metal and a portion of the material of the body in contact therewith;
    d. establishing a temperature gradient in the body substantially parallel with the vertical axis and the first preferred crystal axis of the body
    e. migrating each melt of metal-rich semiconductor material through the body at a predetermined elevated temperature along a path substantially parallel with the established temperature gradient in the direction of the higher temperature of the temperature gradient from the one major surface to, and terminating in, the other of the two major opposed surfaces to form in situ a region of recrystallized semiconductor material of the body having two opposed end surfaces, each being coextensive with a respective one of the two opposed major surfaces and having a predetermined level of concentration of the metal of the melt distributed substantially uniformly throughout the entire region as determined by the solid solubility limit of that metal in that semiconductor material at that predetermined elevated temperature of migration, the metal comprising at least one dopant impurity material therein to impart thereto a predetermined second and opposite type conductivity than that of the material of the body and a predetermined level of resistivity to the region sufficient to render it electrically conductive, and
    f. forming a P-N junction at the contiguous surfaces of the material of each region of recrystallized semiconductor material and that of the body.

2. The process of claim 1 wherein
the vapor deposited metal is substantially oxygen-free.

3. The process of claim 1 wherein
the semiconductor material of the body is one selected from the group consisting of silicon, silicon carbide, germanium and gallium arsenide.

4. The process of claim 3 wherein
the semiconductor material is N-type silicon, and the dopant impurity material is aluminum.

5. The process of claim 1 werein
the preferred planar crystal structure orientation is (100), the first preferred crystal axis is < 100 >, at least one mass of metal is shaped like a metal wire having a longitudinal axis which is substantially aligned parallel with a second preferred crystal axis which is one selected from the group consisting of < 011 > and < 0$\bar{1}$1 >, and each region formed in situ by the migration of a melt of that metal wire is a planar region substantially perpendicular to the major surface having the preferred planar crystal structure orientation.

6. The process of claim 5 wherein
the semiconductor material is N-type silicon, and
the dopant impurity material is aluminum.

7. The process of claim 5 wherein
the width of the melt of metal wire is less than 100 microns.

8. The process of claim 1 wherein
the preferred planar crystal structure orientation is (110)
the first preferred crystal axis is < 110 >,
at least one mass of metal is shaped like a metal wire having a longitudinal axis which is substantially aligned parallel with a second preferred crystal axis is < 110 >.

9. The process of claim 8 wherein
the semiconductor material is N-type silicon, and
the dopant impurity material is aluminum.

10. The process of claim 8 wherein
the width of the melt of metal wire is less than 150 microns.

11. The process of claim 1 wherein
the preferred planar crystal structure orientation is (111),
the first preferred crystal axis of the body is < 111 >,
at least one mass of metal is shaped like a metal wire having a longitudinal axis which is substantially aligned parallel with a second preferred axis, and
each region formed in situ by the migration of a melt of that metal wire is a planar region substantially perpendicular to the major surface having the preferred planar crystal structure orientation.

12. The process of claim 11 wherein
the semiconductor material is N-type silicon, and
the dopant impurity material is aluminum.

13. The process of claim 11 wherein
the width of the melt of the metal wire is less than 500 microns.

14. The process of claim 11 wherein
the second preferred crystal axis is one selected from the group consisting of < 01$\bar{1}$ >, < 10$\bar{1}$ >, < 110 >, < 11$\bar{2}$ >, < $\bar{2}$11 > and < 1$\bar{2}$1 >.

15. The process of claim 14 wherein
the semiconductor material is N-type silicon, and
the dopant impurity material is aluminum.

16. The process of claim 1 including
selectively etching a selective portion of the major surface of the body having the preferred planar crystal structure orientation to form a depression therein for each mass of metal to be deposited therein.

17. The process of claim 16 wherein
the at least one opposed major surface has a preferred planar crystal orientation of (110), and
the first preferred crystal axis is < 110 >.

18. The process of claim 17 wherein
the material of the body is one selected from the group consisting of silicon, silicon carbide, germanium and gallium arsenide.

19. The process of claim 18 wherein
the material of the body is silicon of N-type conductivity, and
the dopant impurity material in the recrystallized silicon is aluminum.

20. The process of claim 17 wherein
at least one mass of metal is shaped like a metal wire having a longitudinal axis aligned substantially parallel with the < 1$\bar{1}$0 > crystal axis, and
each region formed in situ is a planar region substantially perpendicular to the major surface having the preferred planar crystal structure orientation.

21. The process of claim 20 wherein
the width of the melt of metal wire is less than 150 microns.

22. The process of claim 20 wherein
the semiconductor material of the body is one selected from the group consisting of silicon, silicon carbide, germanium and gallium arsenide.

23. The process of claim 22 wherein
the semiconductor material is N-type silicon, and
the dopant impurity material is aluminum.

24. The process of claim 16 wherein
the at least one major surface has a preferred planar crystal orientation of (100), and
the first preferred crystal axis of the body is < 100 >.

25. The process of claim 24 wherein
the material of the body is one selected from the group consisting of silicon, silicon carbide, germanium and gallium arsenide.

26. The process of claim 24 wherein
at least one mass of selective metal has a wire-like shape and a longitudinal axis which is aligned substantially parallel with a second preferred crystal axis which is one selected from the group consisting of < 011 > and < 0$\bar{1}$1 >, and
each region formed in situ is a planar region which is substantially perpendicular to the major opposed surfaces.

27. The process of claim 26 wherein
the width of the melt of metal wire is less than 100 microns.

28. The process of claim 26 wherein
the material of the body is one selected from the group consisting of silicon, silicon carbide, germanium and gallium arsenide.

29. The process of claim 28 wherein
the material of the body is silicon of N-type conductivity, and
the dopant impurity material in the recrystallized silicon is aluminum.

30. The process of claim 16 wherein
the at least one major surface has a preferred planar crystal orientation of (111), and
the first preferred crystal axis of the body is < 111 >.

31. The process of claim 30 wherein
the at least one mass of metal has a preferred second crystal axis which is one selected from the group consisting of < 11$\bar{2}$ >, < $\bar{2}$11 > and < 1$\bar{2}$1 >.

32. The process of claim 30 wherein
the material of the body is one selected from the group consisting of silicon, silicon carbide, germanium and gallium arsenide.

33. The process of claim 32 wherein
the material of the body is silicon of N-type conductivity, and
the dopant impurity material in the recrystallized silicon is aluminum.

34. The process of claim 30 wherein
the material of the body is one selected from the group consisting of silicon, silicon carbide, germanium and gallium arsenide.

35. The process of claim 34 wherein
the material of the body is silicon of N-type conductivity, and
the dopant impurity material in the recrystallized silicon is aluminum.

36. The process of claim 34 wherein
the material of the body is silicon of N-type conductivity, and
the dopant impurity material in the recrystallized silicon is aluminum.

37. The process of claim 30 wherein
at least one mass of metal is shaped like a metal wire having a longitudinal axis which is substantially aligned parallel with a second preferred crystal axis, and
each region formed in situ by the migration of a melt of that metal wire is a planar region substantially perpendicular to the major surface having the preferred planar crystal structure orientation.

38. The process of claim 37 wherein
the width of the melt of the metal wire is less than 500 microns.

39. The process of claim 37 wherein
the at least one mass of metal has a preferred second crystal axis which is one selected from the group consisting of $<01\bar{1}>$, $<10\bar{1}>$ and $<1\bar{1}0>$.

40. The process of claim 39 wherein
the material of the body is one selected from the group consisting of silicon, silicon carbide, germanium and gallium arsenide.

41. The process of claim 40 wherein
the material of the body is silicon of N-type conductivity, and
the dopant impurity material in the recrystallized silicon is aluminum.

\* \* \* \* \*